United States Patent
Dimmler et al.

(10) Patent No.: US 7,642,124 B2
(45) Date of Patent: Jan. 5, 2010

(54) STRUCTURE AND FABRICATION OF SELF-ALIGNED HIGH-PERFORMANCE ORGANIC FETS

(75) Inventors: Klaus Dimmler, Colorado Springs, CO (US); Robert R. Rotzoll, Colorado Springs, CO (US)

(73) Assignee: OrganicID, Inc., Colorado Springs, CO (US)

( * ) Notice: Subject to any disclaimer, the term of this patent is extended or adjusted under 35 U.S.C. 154(b) by 0 days.

(21) Appl. No.: 12/123,725

(22) Filed: May 20, 2008

(65) Prior Publication Data

US 2008/0220562 A1    Sep. 11, 2008

Related U.S. Application Data

(62) Division of application No. 11/380,517, filed on Apr. 27, 2006, now abandoned.

(51) Int. Cl.
*H01L 21/00* (2006.01)
(52) U.S. Cl. ............ 438/99; 438/106; 257/40; 257/E51.003; 257/E51.024; 257/E51.027; 257/E51.033
(58) Field of Classification Search ............ 438/99, 438/106; 257/40, E51.002–E51.008, E51.025–E51.027, 257/E51.031–E51.033
See application file for complete search history.

(56) References Cited

U.S. PATENT DOCUMENTS

| | | | | |
|---|---|---|---|---|
| 5,430,013 | A * | 7/1995 | Inada et al. | 505/235 |
| 6,159,861 | A * | 12/2000 | Asai et al. | 438/706 |
| 2003/0175427 | A1 | 9/2003 | Loo et al. | |
| 2003/0218166 | A1 | 11/2003 | Tsutsui | |
| 2005/0211976 | A1 | 9/2005 | Redecker et al. | |
| 2005/0230680 | A1 | 10/2005 | Endoh et al. | |
| 2006/0001726 | A1 | 1/2006 | Kodas et al. | |
| 2007/0075308 | A1 * | 4/2007 | Dotz et al. | 257/40 |

OTHER PUBLICATIONS

Garnier, Francis, Hajlaoui, Riadh, El Kassmi, Mohamed, "Vertical device architecture by molding of organic-based thin film transistor", Applied Physics Letters, vol. 73, No. 12, Sep. 21, 1998, pp. 1721-1723.

(Continued)

*Primary Examiner*—M. Wilczewski
*Assistant Examiner*—Telly D Green

(57) ABSTRACT

A low channel length organic field-effect transistor can be produced in high volume and at low cost. The transistor structure includes successively deposited patterned layers of a first conductor layer acting as a source terminal, a first dielectric layer, a second conductor layer acting as a drain terminal, a semiconductor layer, a second dielectric layer, and a third conductor layer acting as the gate terminal. In this structure, the transistor is formed on the edge of the first dielectric between the first conductor layer and the second conductor layer. The second conductor layer is deposited on the raised surfaces formed by the dielectric such that conductive ink does not flow into the trough between the dielectric raised surfaces. This is accomplished by coating a flat or rotary print plate with the conductive ink, and applying the appropriate pressure to deposit the materials only on the raised surfaces of the dielectric. The second metal is automatically aligned to the layer beneath it. Due to this self-alignment and the short channel formed by the thickness of the dielectric material, a high-performance FET is produced without the requirement of high-resolution lithography equipment.

17 Claims, 15 Drawing Sheets

OTHER PUBLICATIONS

Stutzmann, Natalie, Friend, Richard H., Sirringhaus, Henning, "Self-Aligned, Vertical-Channel, Polymer Field-Effect Transistors", Science, vol. 299, Mar. 21, 2003, pp. 1881-1884.

Hirashima, Naoki, Ohashi, Noboru, Nakamura, Masakazu, Kudo, Kazuhiro, "Fabrication of Organic Vertical-Type Field-Effect Transistors Using Polystyrene Spheres as Evaporation Mask", Proc. Int. Symp. Super-Functionality Organic Devices, IPAP Conf. Series 6, Mar. 30, 2005, pp. 158-160.

Parashkov, R., et al., "Vertical channel all-organic thin-film transistors", Applied Physics Letters, vol. 82, No. 23, Jun. 23, 2003, pp. 4579-4580.

Parashkov, R., et al., "Organic vertical-channel transistors structured using excimer laser", Applied Physics Letters, vol. 85, No. 23, Dec. 6, 2004, pp. 5751-5753.

* cited by examiner

STRUCTURE AND FABRICATION OF SELF-ALIGNED HIGH-PERFORMANCE ORGANIC FETS

RELATED APPLICATION

The present application claims priority from, and is a divisional of, U.S. patent application Ser. No. 11/380,517 filed on Apr. 27, 2006, the disclosure of which is herein specifically incorporated in its entirety by this reference.

FIELD OF INVENTION

The present invention relates to organic transistors and, more particularly, to a structure and method of fabricating high performing organic FETs utilizing an efficient high volume self-aligned patterning technique to produce low channel length organic FET devices.

DESCRIPTION OF RELATED ART

Organic field-effect transistors (oFETs) have been proposed for a number of applications including displays, electronic barcodes and sensors. Low cost processes, large-area circuits and the chemically active nature of organic materials are the chief driving forces to make OFETs important in various applications. Many of these objectives depend on a method of fabrication utilizing printing techniques such as flexography, gravure, silk screen and inkjet printing.

Organic MOS transistors are similar to silicon metal-oxide-semiconductor transistors in operation. The major difference in construction is that the organic MOS transistor utilizes a thin layer of a semiconducting organic polymer film to act as the semiconductor of the device, as opposed to a silicon layer as used in the more typical in-organic silicon MOS device.

Referring now to FIG. 1, a cross-sectional diagram of a top-gate bottom contact organic MOS transistor 100 is shown. Two conductor regions 101 and 102 are deposited and patterned on substrate 112. The gap between conductive regions 101 and 102 is known as the "channel", and is designated as 103 in FIG. 1. A semiconductor layer 104 is deposited on the conductive regions 101 and 102. A thin film of dielectric material 106 is deposited on top of semiconductor layer 104. A conductive film 108 is deposited and patterned on top of organic semiconductor 106 to form the gate, such the gate completely overlaps the channel region 103.

Through an electrical field effect, a voltage is applied between gate conductor 108 and source 101 modifies the resistance of the organic semiconductor in the channel region 103 in the vicinity of the interface between the semiconductor region 104 and the dielectric 106. When another voltage is applied between source 101 and drain 102, a current flows between the drain and the source that depends on both the gate-to-source and the drain-to-source voltages.

Organic semiconductor materials are often classified as polymeric, low molecular weight, or hybrid, Pentacene, hexithiphene, TPD, and PBD are examples of low weight molecules. Polythiophene, parathenylene vinylene, and polyphenylene ethylene are examples of polymeric semiconductors. Polyvinyl carbazole is an example of a hybrid material. These materials are not classified as insulators or conductors. Organic semiconductors behave in a manner that can be described in terms analogous to the band theory in inorganic semiconductors. However, the actual mechanics giving rise to charge carriers in organic semiconductors are substantially different from inorganic semiconductors. In inorganic semiconductors, such as silicon, carriers are generated by introducing atoms of different valencies into a host crystal lattice, the quantity of which is described by the number of carriers that are injected into the conduction band, and the motion of which can be described by a wave vector k. In organic semiconductors, carriers are generated in certain materials by the hybridization of carbon molecules in which weakly bonded electrons, called $\pi$ electrons, become delocalized and travel relatively long distances from the atom which originally gave rise to the electron. This effect is particularly noted in materials comprising conjugated molecules or benzene ring structures. Because of the delocalization, these $\pi$ electrons can be loosely described as being in a conduction band. This mechanism gives rise to a low charge mobility, a measure describing the speed with which these carriers can move through the semiconductor, resulting in dramatically lower current characteristics of organic semiconductors in comparison to inorganic semiconductors.

Besides a lower mobility, the physics of carrier generation gives rise to another key difference between the operation of an organic MOS transistor and inorganic semiconductor. In the typical operation of an inorganic semiconductor, the resistance of the channel region is modified by an "inversion layer" consisting of the charge carriers made up of the type of charge that exists as a minority in the semiconductor. The silicon bulk is doped with the opposite type of carrier as compared to that used for conduction. For example, a p-type inorganic semiconductor is built with an n-type semiconductor, but uses p-type carriers, also called holes, to conduct current between the source and drain. In the typical operation of an organic semiconductor, however, the resistance of the channel region is modified by an "accumulation layer" consisting of charge carriers made up of the type of charge that exists as a majority in the semiconductor. For example, a PMOS organic transistor uses a P-type semiconductor and p-carriers, or holes, to generate the current in typical operation.

Though organic transistors have much lower performance than inorganic transistors, the materials and processing techniques to produce organic transistors cost significantly less those used to produce inorganic transistors. Therefore, organic transistor technology has application where low cost is desired and low performance is acceptable. The performance of a transistor, both organic and inorganic, depends in part on the channel length, defined as the space between and source and drain. The maximum frequency of operation is inversely proportional to the square of this channel length. Therefore, it is desirable to reduce this space as much as possible. Low cost printing techniques are generally limited to a minimum range of 25µ. Printing at resolutions finer than this is generally not possible.

In the prior art, transistors structures wherein the source and drain are vertical to each other have been proposed. This type of structure has the advantage that a small gap between the source and drain can be achieved without having to print at such high resolution. FIG. 2 illustrates the basic structure. The first conductor metal-source 204 and second conductor metal-drain 206 are deposited on either side of a first dielectric layer 208. The channel of the transistor is defined by the surface 209 between the first metal and the second metal conductors, thereby defining the channel length by the thickness of the first dielectric. A second dielectric 207 and a third conductor 214 are then deposited on that surface to complete the transistor. A high performance short-channel length transistor has thereby been produced without the need to print the short gap between the source and drain.

A key to successful implementation of this structure is the alignment of metal-drain 206 and the beginning of the slope 211 of first dielectric 208.

FIG. 3 illustrates the consequences of poor alignment between metal-drain 306 and the underlying first dielectric layer 308. When layers are aligned, there is always an alignment tolerance which specifies the accuracy by which one layer can be produced with respect to another layer below it. If the conductor is printed onto the slope, the ink will flow to short to the metal-source 304, rending the transistor nonfunctional. Therefore, it is necessary to allow a tolerance from the edge of the slope so that it can be guaranteed that the ink will not print on the slope 309 of dielectric 308. Consequently, the metal-drain layer 306 must be produced allowing a gap on the surface of dielectric 308 to ensure that in the worse case misalignment, the metal-drain 306 layer falls on point 311 at the edge of the dielectric slope 309. However, the channel length of the nominal device is now defined by the total distance between metal-drain 306 and metal-source 304, which now is now the slope 309 plus the gap 313 on the surface of dielectric 308. Since the alignment tolerance is likely to be large compared to the thickness of dielectric 308, the additional gap 313 is likely to be quite large in comparison. The advantages of the short channel length that can potentially be obtained through vertical transistors is consequently lost. For this reason, an effective vertical transistor requires a process that eliminates this alignment tolerance.

One such method known in the prior art to eliminate this alignment tolerance is described by Natalie Stutzmann, Richard Friend, and Henning Sirringhause in Science on Mar. 21, 2004 in an article entitled "Self-Aligned, Vertical-Channel Polymer Field-Effect Transistors." FIG. 4 illustrates the methodology by which this is done. Referring to FIG. 4, a V-shaped impression die 410 is pressed through previously deposited layers consisting of first metal metal-source 404, first dielectric 406, and second metal 408. When the impression die 410 is lifted, a cut is made through the layers forming a sloped dielectric 406 while cutting the second metal 408 at the top of the dielectric slope. However, several issues make this fabrication method impractical. A serious problem with this method is that the metal 408 layer smears when pressing the impression die through the layers, thereby shorting second conductor 408 and first conductor 404. Another problem with this method is that the die impression forms a point at the bottom of the device, which is very difficult to deposit layers of controlled thickness in this region. One further problem with this method is that pressure controls the impression die depth of penetration. If the impression die pressure is too light, the impression will not penetrate to the first metal layer 404. If the impression die pressure is too heavy, the impression die will penetrate substrate 402, adversely affecting the performance of the transistors. The range of pressure is therefore defined by the thickness of the first conductor 404, a pressure variation that is too narrow for high-volume low-cost manufacturing methods.

What is desired, therefore, is a practical structure for an organic FET that brings about a small channel length utilizing low cost printing techniques.

SUMMARY OF THE INVENTION

According to the present invention, a structure and method of fabrication is disclosed that can produce low channel length devices in high volume and at low cost. The structure includes successively deposited patterned layers of a first conductor layer acting as a source terminal, a first dielectric layer, a second conductor layer acting as a drain terminal, a semiconductor layer, a second dielectric layer, and a third conductor layer acting as the gate terminal. In this structure, the transistor is formed on the edge of the first dielectric between the first conductor layer and the second conductor layer.

The second conductor layer is deposited on the raised surfaces formed by the dielectric such that the ink does not flow into the trough between the dielectric raised surfaces. In an embodiment of the invention, this is accomplished by coating a flat or rotary print plate with a conductive ink, and applying the appropriate pressure to deposit the materials only on the raised surfaces of the dielectric. In this manner, the second metal is automatically aligned to the layer beneath it. Due to this self-alignment and the short channel formed by the thickness of the dielectric material, a high-performance FET is produced without the requirement of high-resolution lithography equipment.

BRIEF DESCRIPTION OF THE DRAWINGS

The present invention is illustrated by way of example and not by limitation in the accompanying figures in which like reference numerals indicate similar elements and in which.

DETAILED DESCRIPTION

Figure 1:
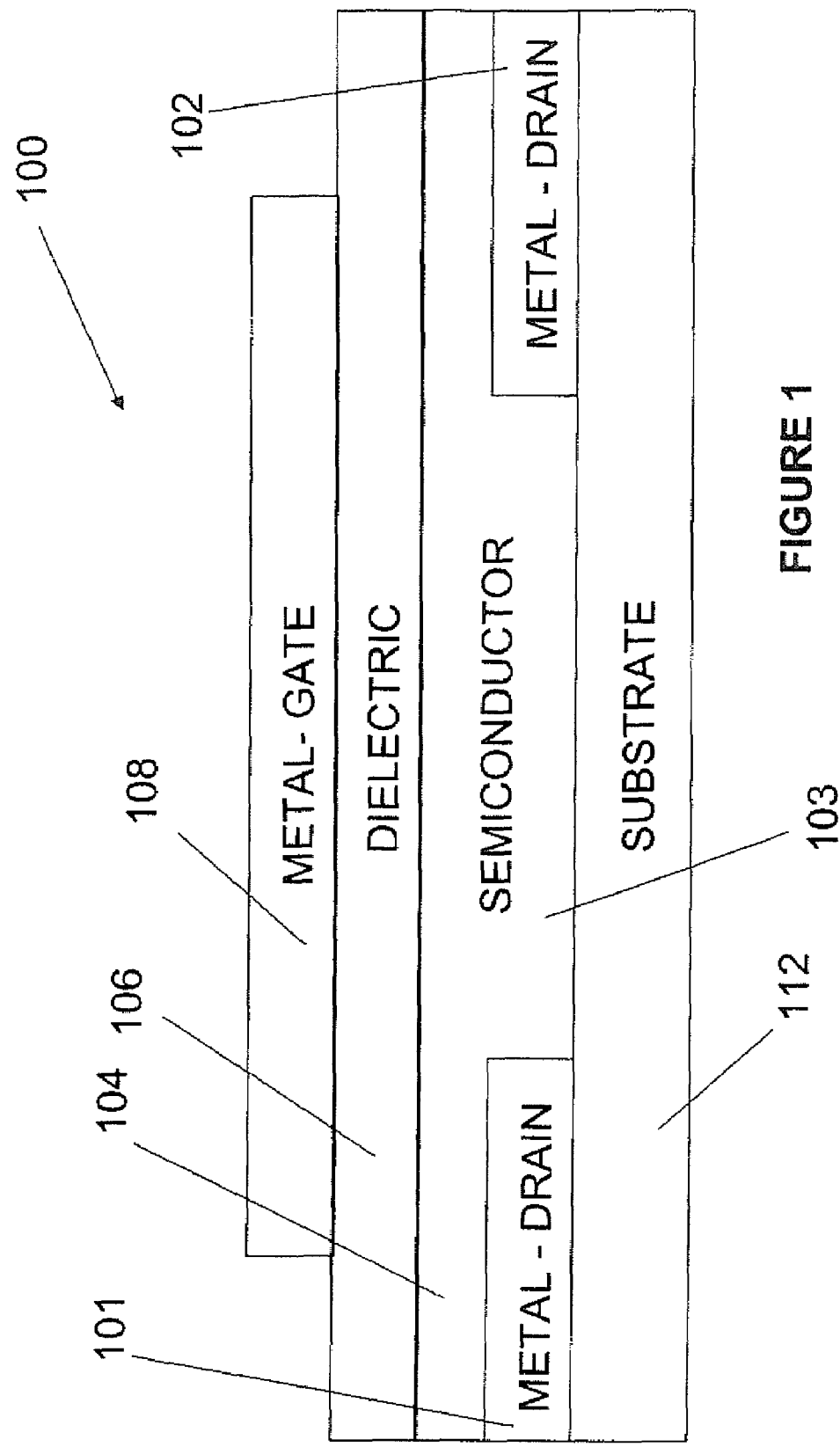
FIG. 1 is a cross-sectional view of an organic FET transistor including an insulating substrate, organic polymer film, dielectric layer, and conductive gate according to the prior art.
Figure 2:
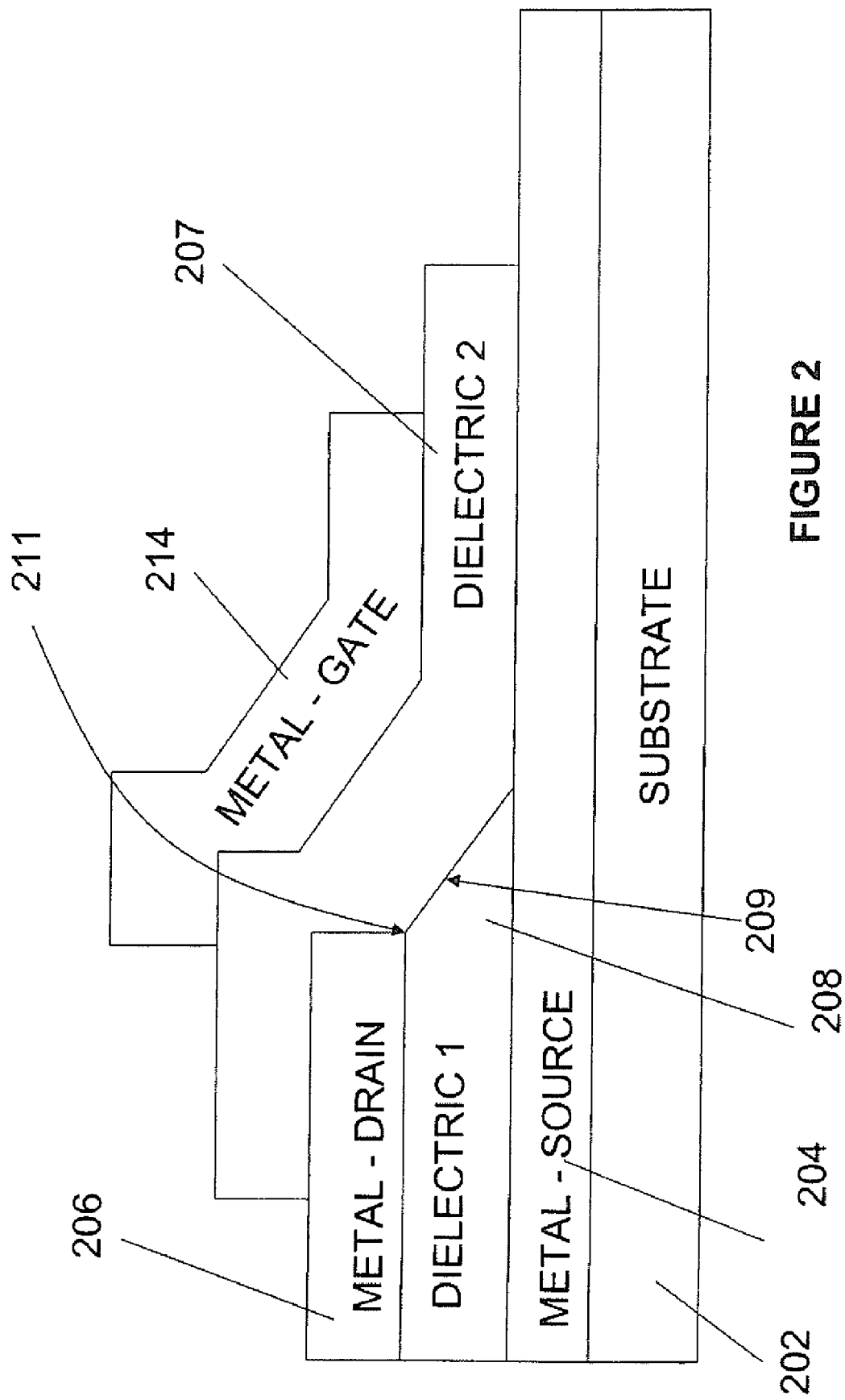
FIG. 2 is a cross-sectional view of an vertical FET transistor including an insulating substrate, organic polymer film, dielectric layer, and conductive gate according to the prior art.
Figure 3:
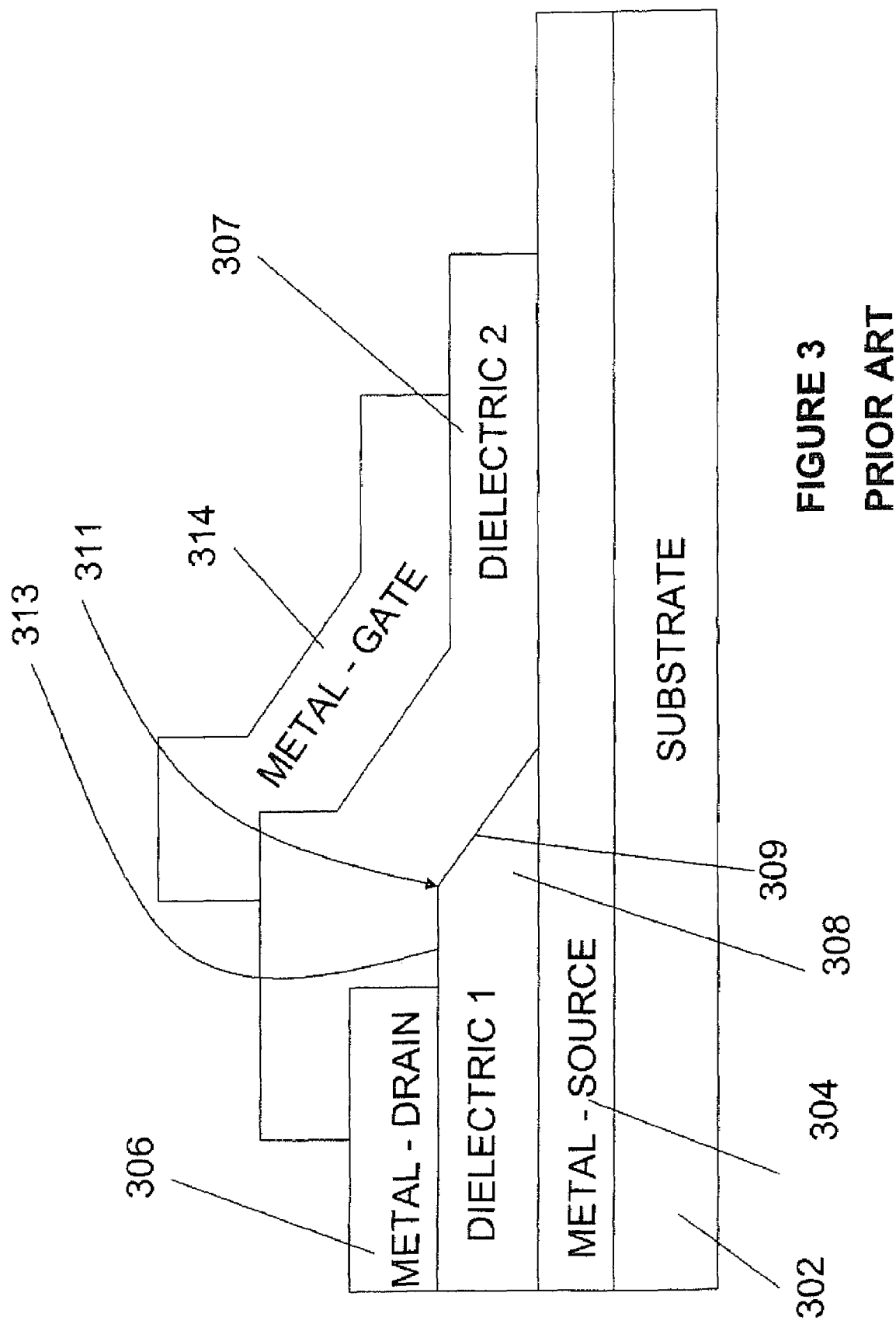
FIG. 3 is a cross-sectional view of an vertical FET transistor according to the prior art illustrating the consequences of poor alignment between the metal and dielectric layers.
Figure 4:
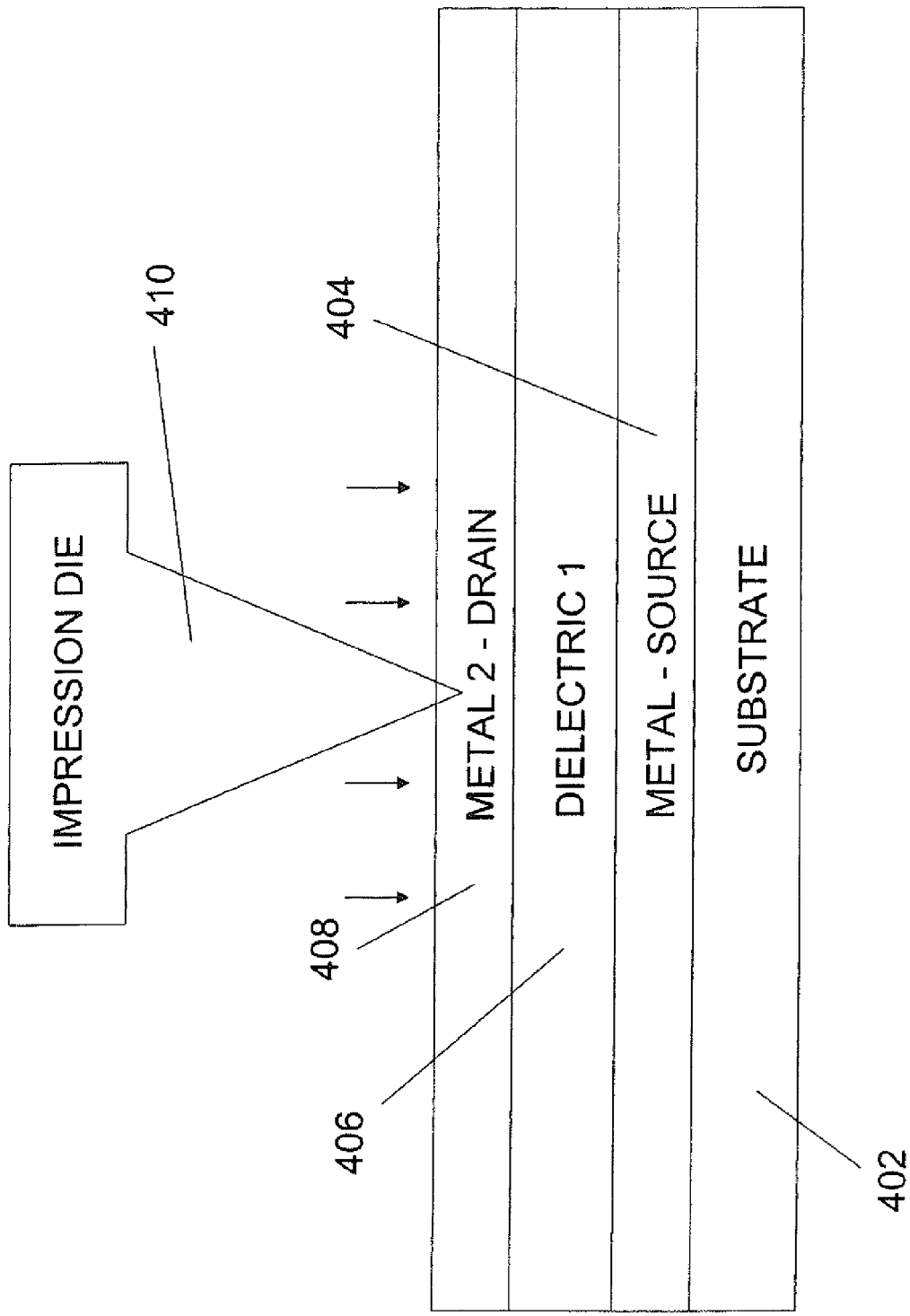
FIG. 4 is a cross-sectional view illustrating the "V-grove" method of achieving self-alignment between metal and dielectric according to the prior art.
Figure 5:
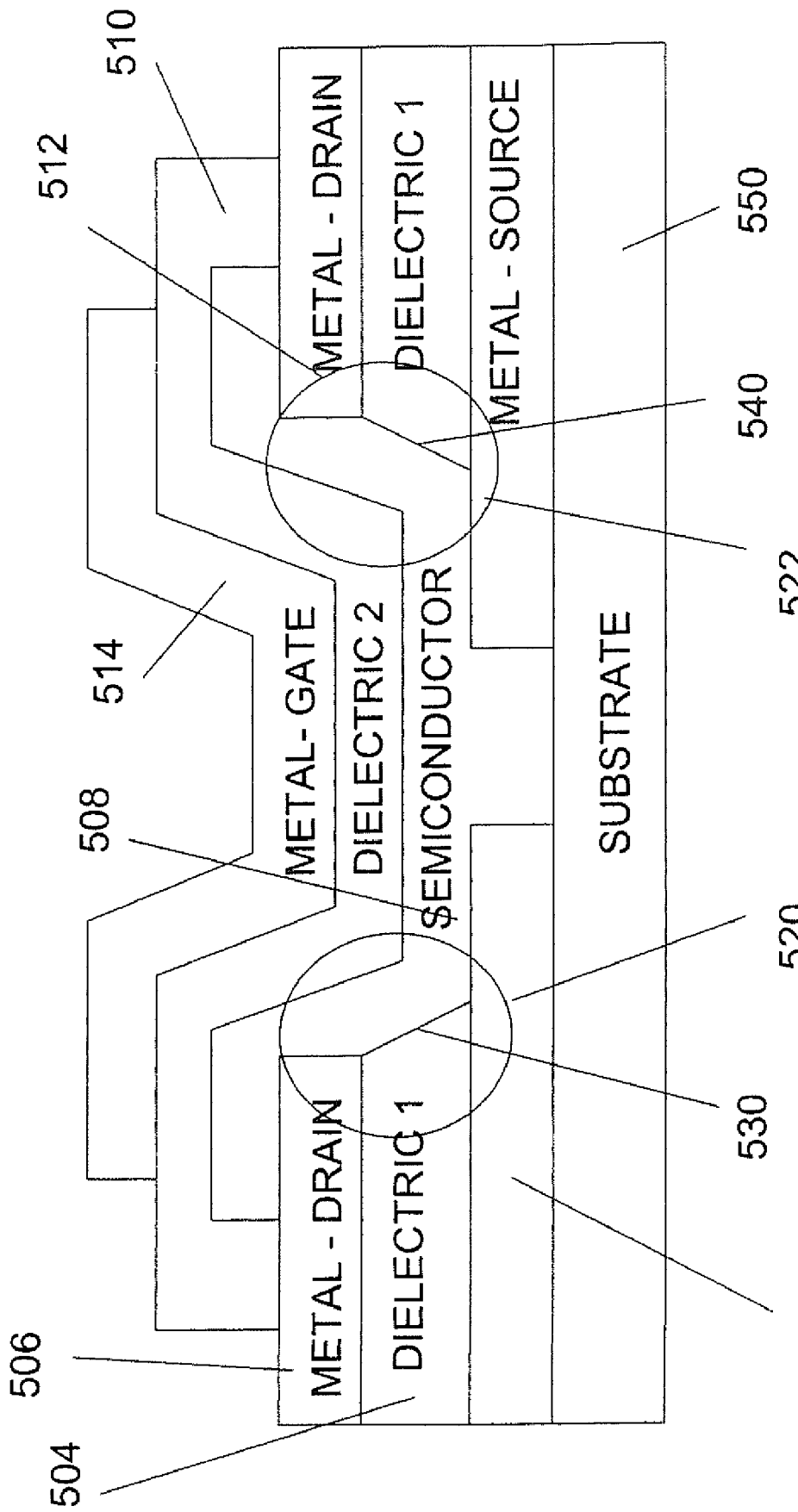
FIG. 5 illustrates a structure to produce vertical organic FET transistors according to one embodiment of the present invention.

Referring now to FIG. 5, one embodiment of this invention is illustrated. The structure is formed by depositing successive patterned layers of a conductor metal-source 502, a first insulator dielectric 504, a conductor metal-drain 506, a semiconductor 508, a second insulator dielectric 510, a conductor metal-drain 512 and a conductor metal-gate 514 on substrate 550.

Referring to FIG. 5, region 520 signifies a transistor formed by this structure. The source of this device is formed by metal-source 502, and the drain is formed by metal-drain 506. The vertical space between metal-drain 506 and metal-source 502 forms the channel region 530 of the device in region 520. The channel region 530 is overlapped by successive layers of a semiconductor 508, dielectric 2 510, and metal gate 514. The gate terminal of the transistor in region 520 is metal-gate 514.

Referring to FIG. 5, region 522 signifies a second transistor formed by the same structure. The gap 540 is the channel of this transistor. In this implementation, the transistors 520 and 522 share the same electrical connection for the gate terminal. The drain terminal and the source terminal are electrically independent terminals.

Figure 6:
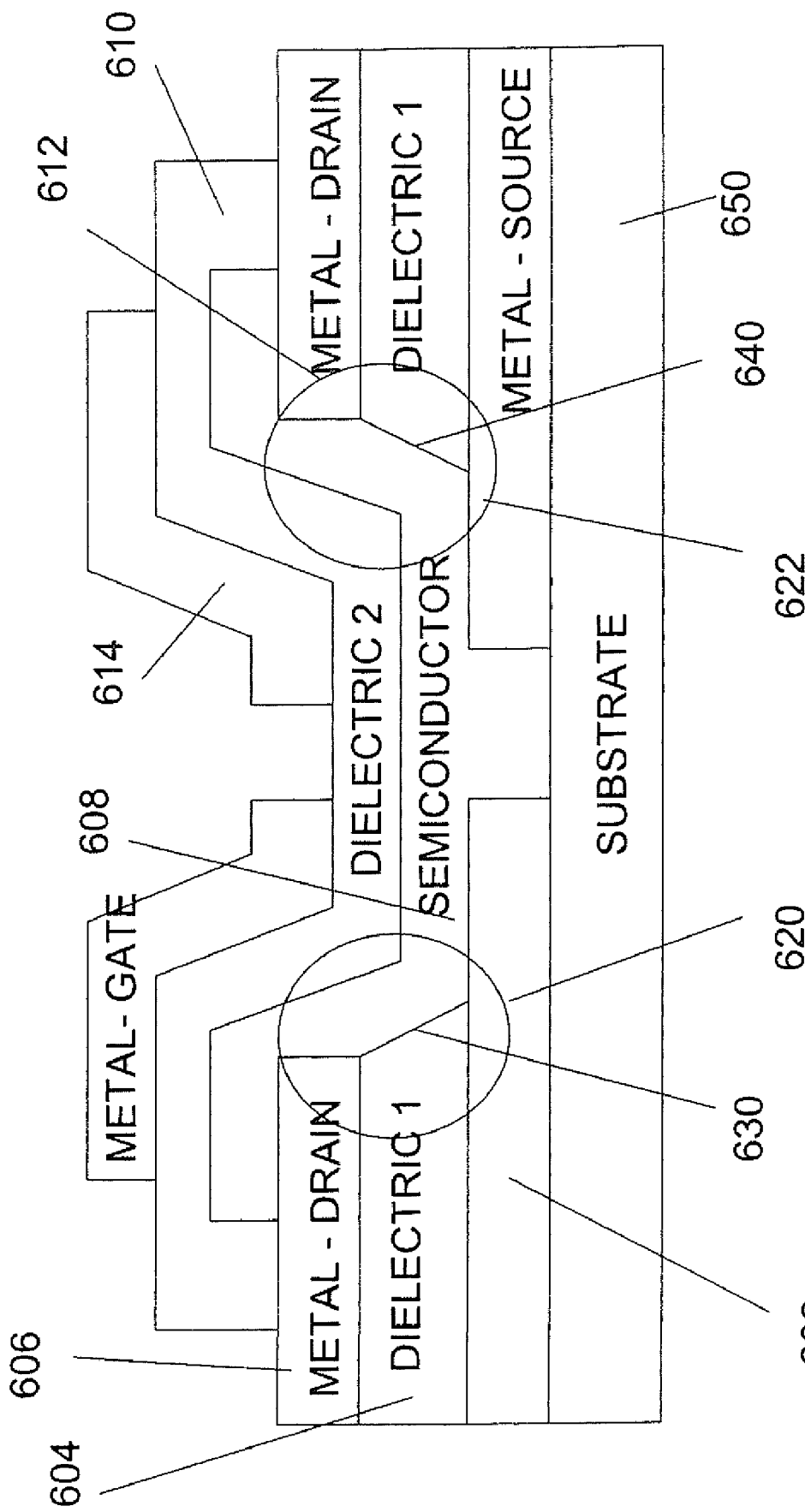
FIG. 6 illustrates a structure to produce vertical organic FET transistors with separate gate, source and drain terminals according to another embodiment of the present invention.

FIG. 6 illustrates another implementation of this invention in which the metal-gate layer and the metal-source layer are not continuous between regions 620 and 622. This structure, therefore, has electrically independent source, drain, and gate terminals.

Figure 7:
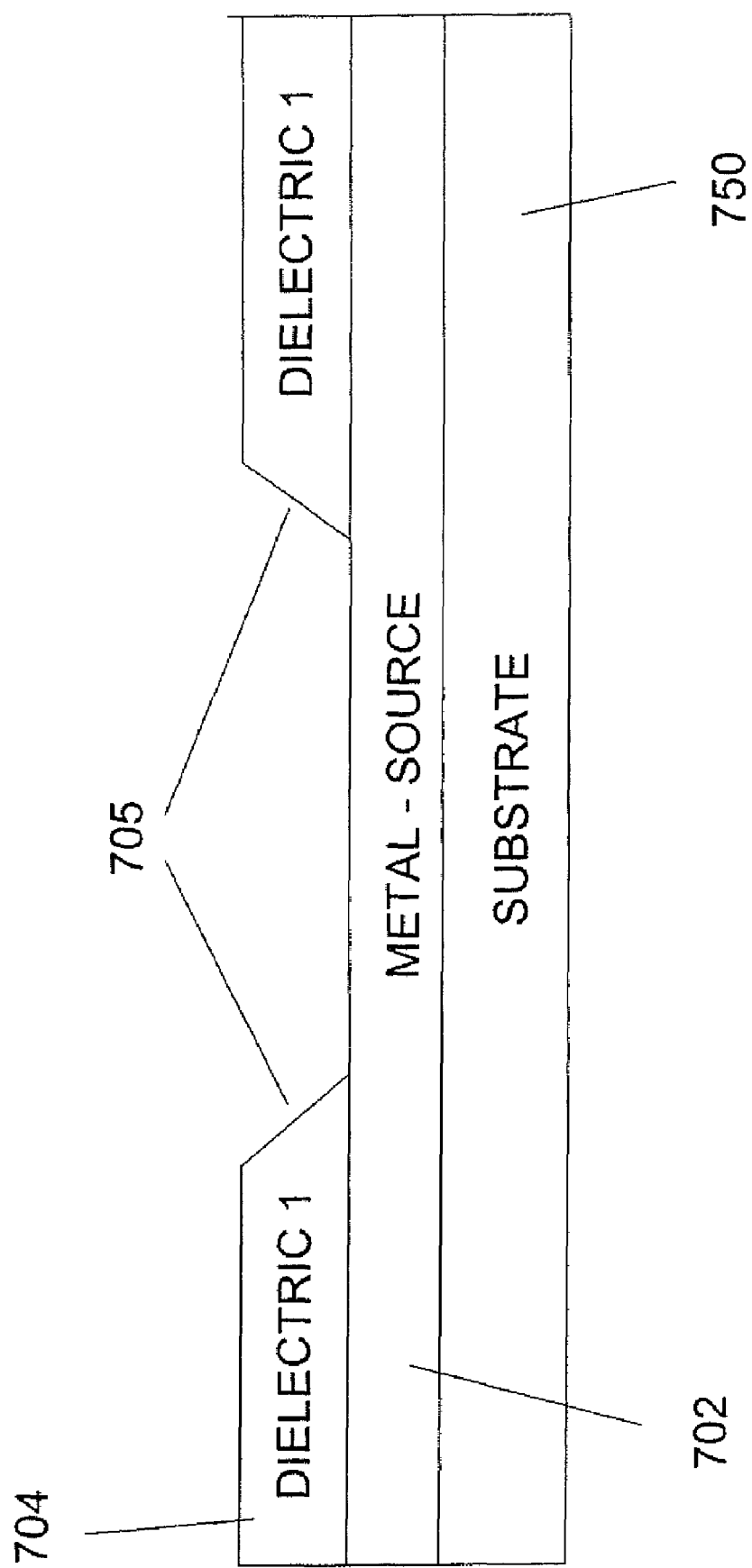
FIGS. 7-13 illustrate the various process steps to produce the structure according to one embodiment of the present invention.

FIG. 7 illustrates the beginning of the process to form the structure described above. A conductor metal-source 702 is deposited on substrate 750. The particular implementation in this illustration shows a continuous layer, but this layer is typically patterned to form independent source terminals for each transistor. The preferred method of patterning is achieved by additive methods such as gravure, flexography, ink jet painting, or offset lithography. Materials suitable for the metal-source can be any solution-based conductor, including flake silver ink, flake gold ink, nano-particle silver ink, nano-particle gold ink, PEDOT, polythiophene, and polyanalene. Alternatively, this patterning can by achieved through a subtractive process whereby the substrate is first coated by methods such as a doctor-blading, followed by a patterning step via etching, lift-off, laser ablation, or otherwise remove unwanted material. Subtractive methodology can also be used for conductor metals using non-printable deposition techniques such as evaporation, sputtering, and sublimation.

Still referring to FIG. 7, a patterned dielectric layer 704 is deposited. The preferred method of patterning is achieved by depositing a solution-based dielectric using additive methods such as gravure, flexography, ink jet painting, or offset lithography. Alternatively, this patterning can by achieved through a subtractive process whereby the substrate is first coated by methods such as evaporation, sputtering, sublimation, or doctor-blading, followed by a patterning step via etching, lift-off, laser ablation, or otherwise remove unwanted material.

The slope of the edges 705 of the first dielectric layer 754 is an important consideration in the formation of this structure since subsequent layers will form the active transistors on this surface. When using an additive deposition method, this slope can be controlled by appropriately adjusting the surface tension of the dielectric solution and the surface energy of the underlying deposition surface. The surface tension of the ink can be modified by methods such as adding surfactants and by adjusting the weight-to-solid ration of the solution. The surface energy of the surface to be deposited can be modified by methods such as corona treatment, oxygen plasma, ultraviolet exposure, and ozone treatments.

Figure 8:
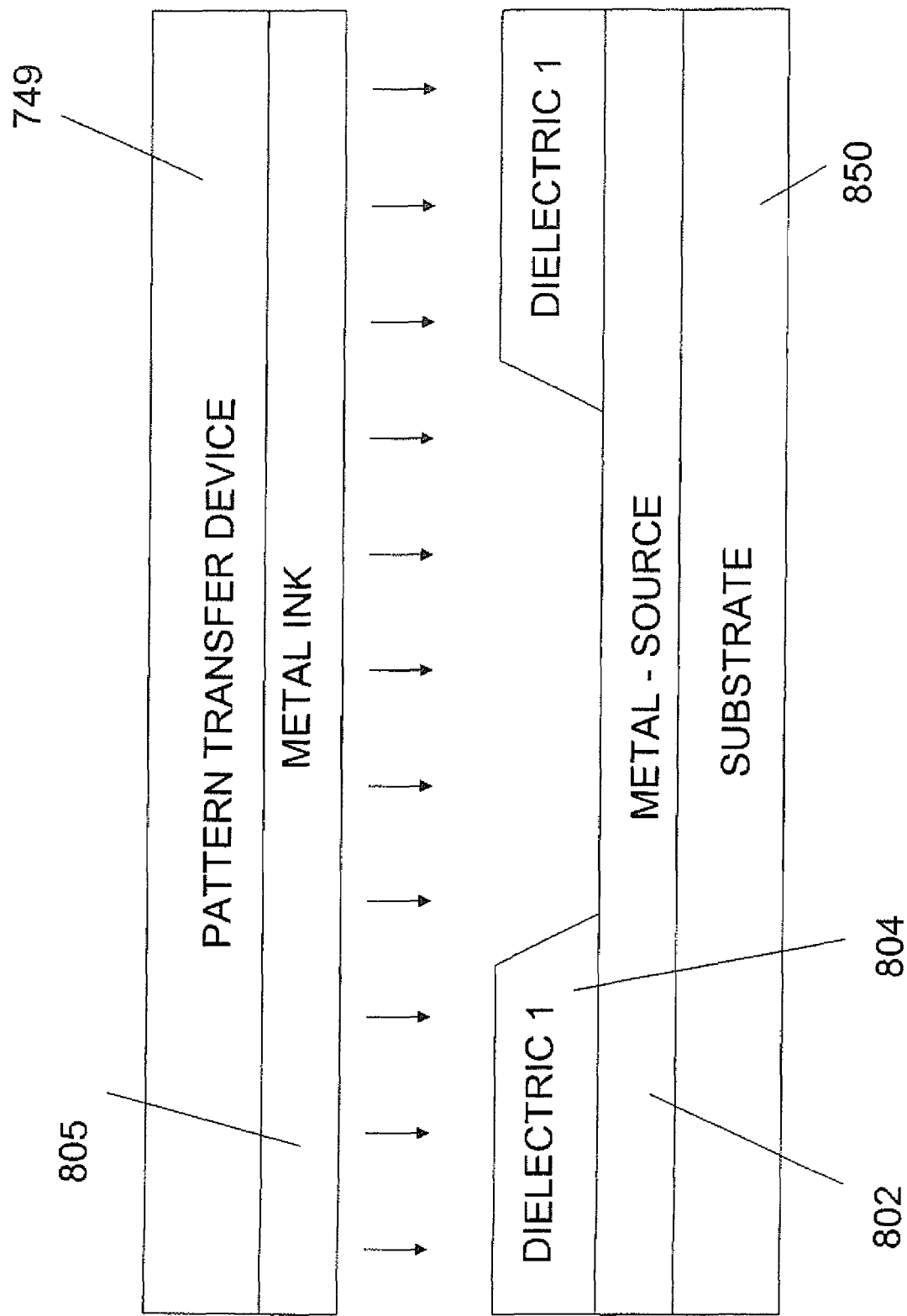

FIG. 8 has the same layers as the previous figure, like layers labeled with like numbers. In particular, a metal-source layer 802 and a dielectric layer 804 is deposited on substrate 850. The next layer is deposited by coating the surface of a flat print plate or a rotary print roll with conductive ink. The conductive ink could be solution-based flake conductor ink, solution-based nano-particle metal ink, PEDOT, polyanalene, polythiophene, or some other solution-based conductive fluid. The print pressure of the print plate and the materials of which the print plates are formed are appropriately adjusted such that the ink will transfer onto the raised surface formed by the first dielectric 804, but such that it will not transfer into the troughs between the raised surface formed by the dielectric pattern. This mechanism will result in a self-aligned metal coating onto the first dielectric, thereby eliminating the need to align two layers by other means such as optical alignment.

Figure 9:
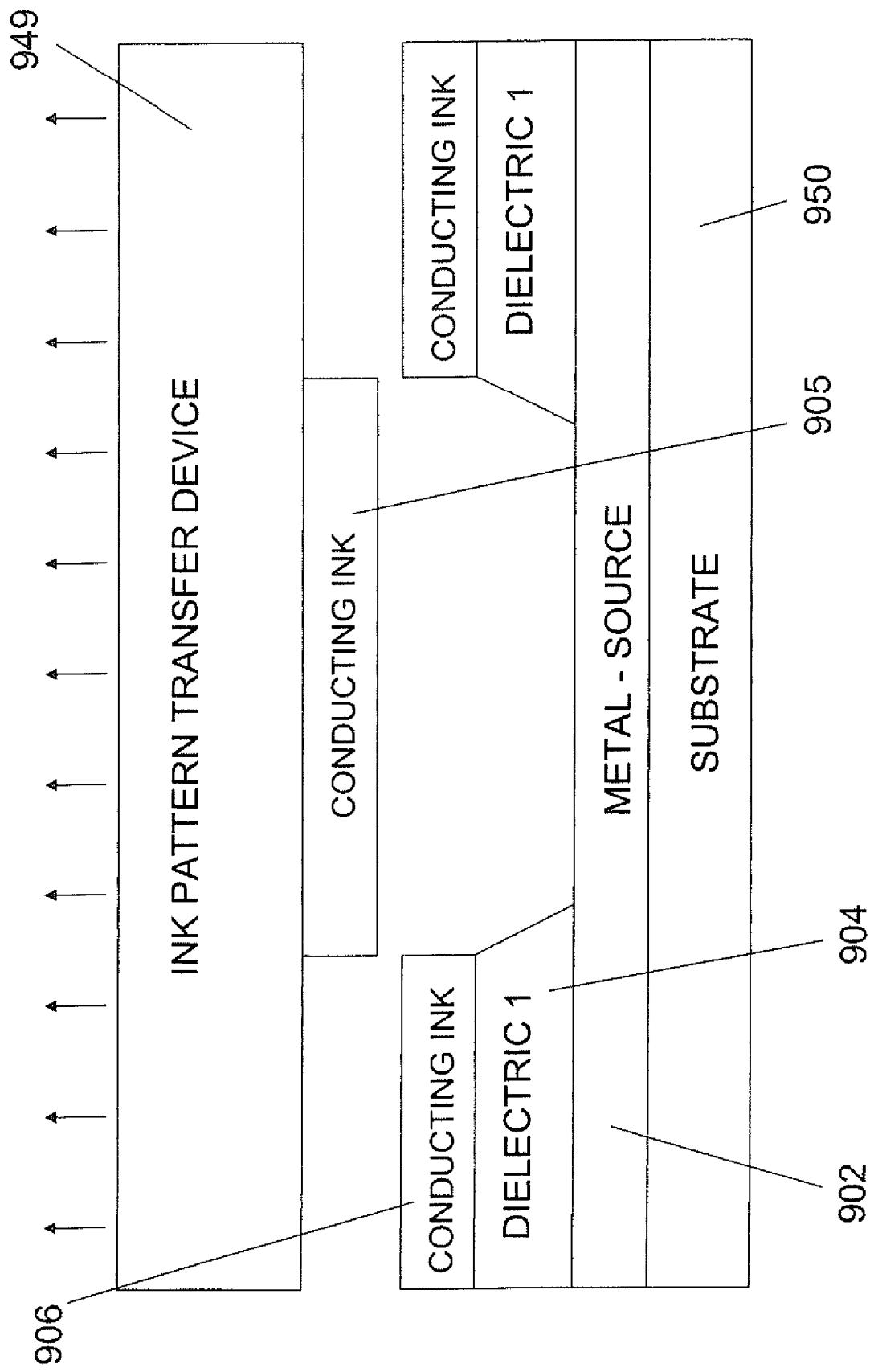

FIG. 9 illustrates the intended behavior of the metal ink that coated transfer device 949. The ink that touches the raised surfaces formed by dielectric 904 sticks to the surface of that dielectric. The trough formed between the raised dielectric surfaces are sufficiently deep that the ink does not penetrate inside the trough. When transfer device 949 is lifted, the conductive ink 905 corresponding to the regions of the toughs remains on the transfer device, and does not transfer onto the surface of the circuit.

Figure 10:
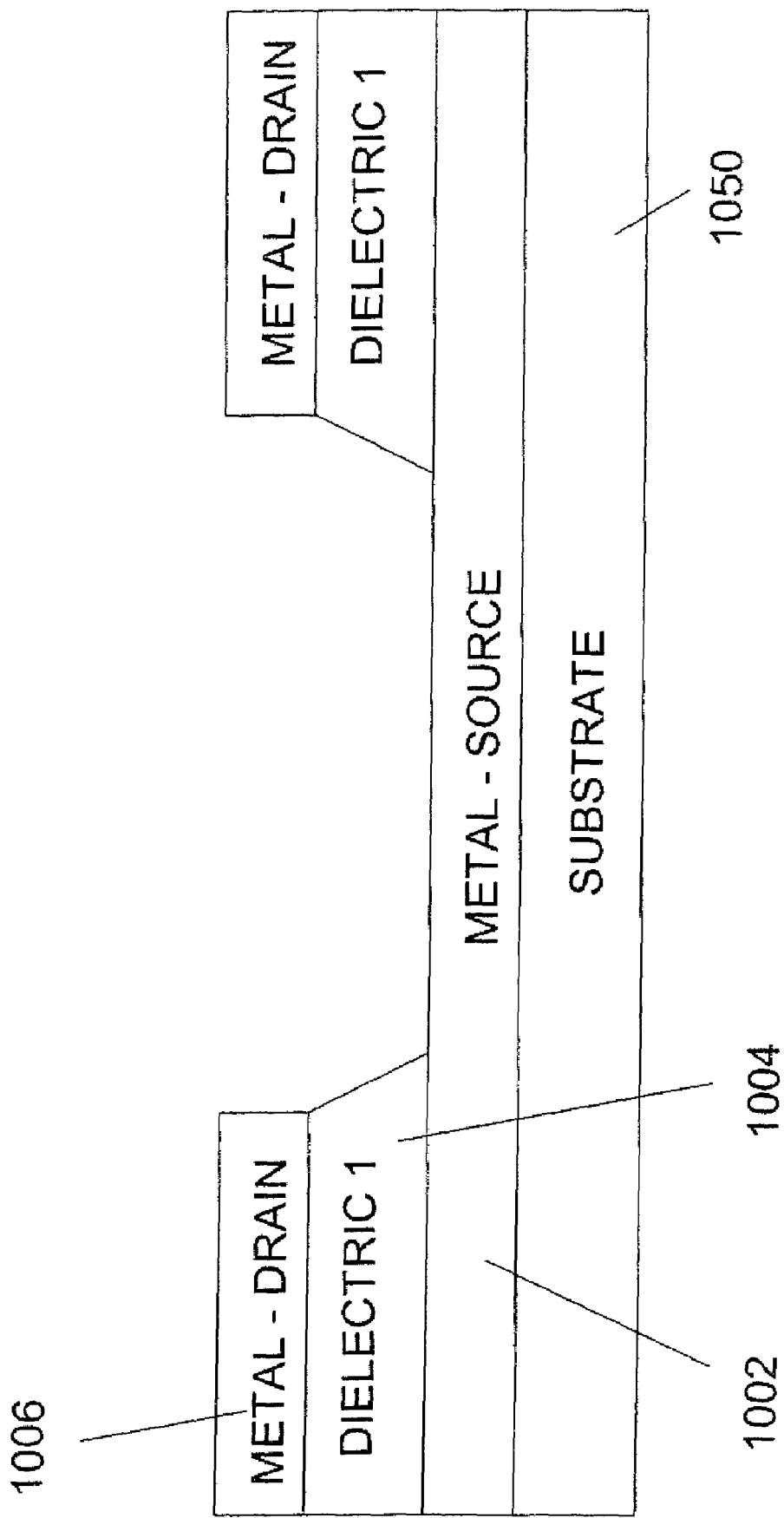

FIG. 10 shows the resulting structure after the self-aligned metal deposition is complete. Metal-source 1002, first dielectric layer 1004, and metal-drain 1006 are now deposited on substrate 1050. The metal-drain 1006 is self-aligned with the edge of dielectric 1004.

Figure 11:
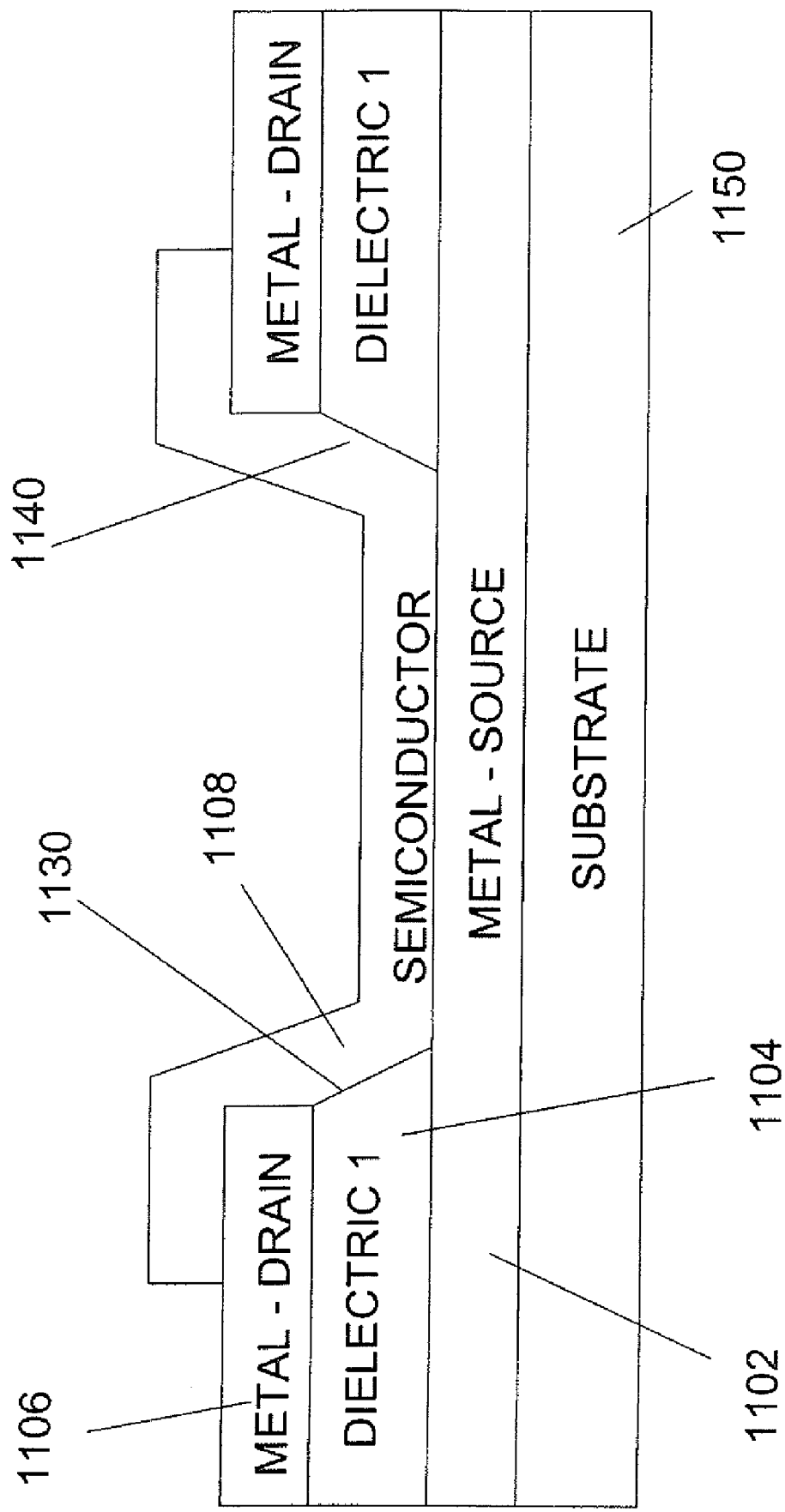

FIG. 11 illustrates the next processing step in this process, the deposition of the semiconductor layer 1108. This layer can be continuous as shown in the FIG. 11, but could also be patterned. The functional requirement is that the semiconductor is deposited on the vertical surface 1130 and 1140 on first dielectric 1104, between metal-drain 1106 and metal-source 1102. This area will become the channel region of the transistor. Semiconductor materials include low molecular materials such as pentacene, hexithiphene, TPD, and PBD and polymer materials such as polythiophene, parathenylene vinylene, and polyphenylene ethylene. Hybrid materials such polyvinyl carbazole are also good candidates for the semiconductor materials. Deposition methods include additive methods such as flexography, gravure, silk screening, or offset lithography. Deposition methods also include subtractive methods such as coating methods, evaporation, sputtering, and sublimation.

Figure 12:
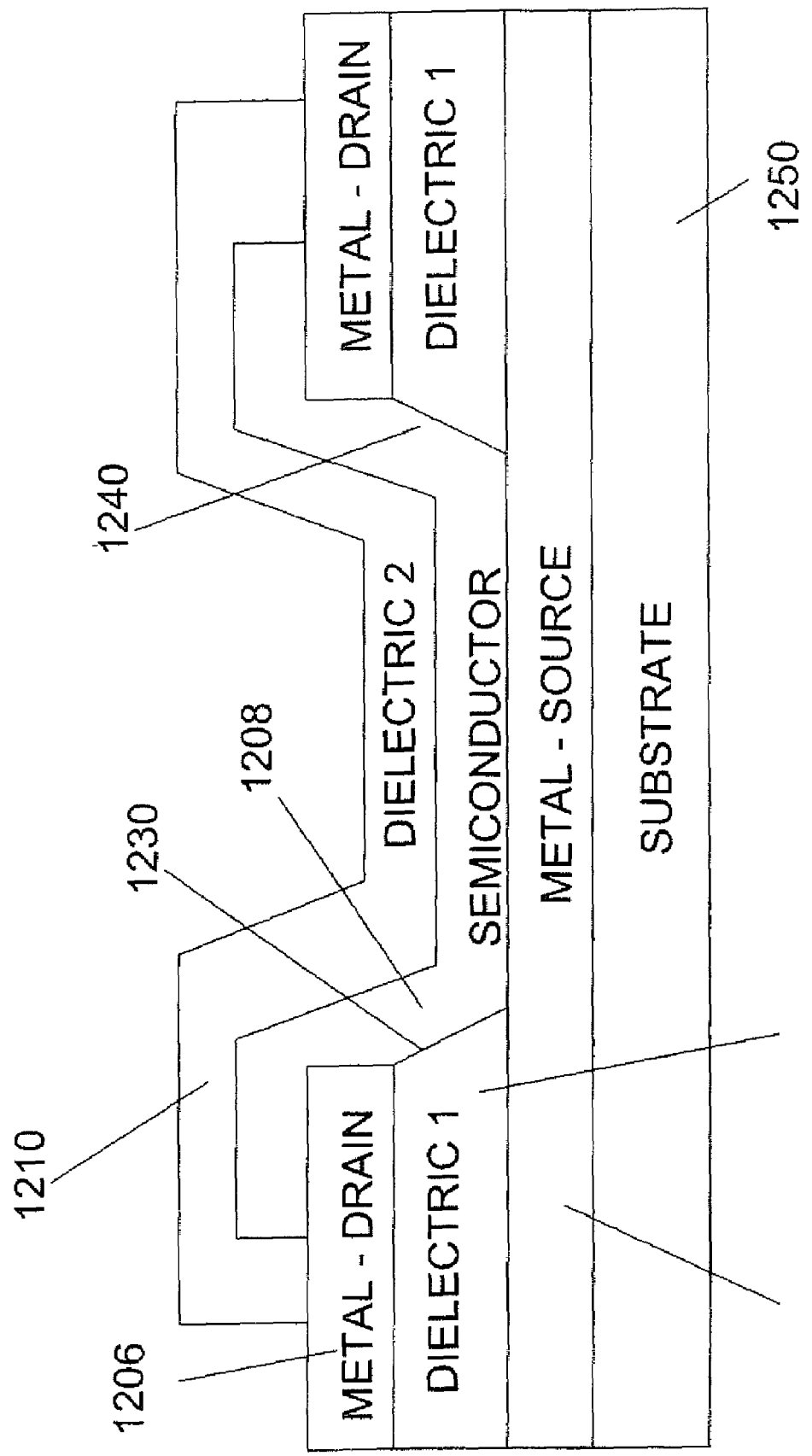

FIG. 12 illustrates the deposition of the second dielectric 1210. This layer must enclose the semiconductor pattern 1240. The dielectric material is preferably a material that is printable, such materials including inorganic precursors such as spin-on-glass or polymer-based dielectric such as cross-linked polyvinylphenol (PVP), polypropylene, CYTOP, polyvinylalcohol, polyisobutylene, PMMA, polyethylene terephthalate (PET), poply-p-xylylene, and CYMM. Alternatively, the dielectric could be a material that is evaporated, sputtered or grown through thermal and chemical reactions, and subsequently patterned by etching or laser ablation. Deposition methods include additive methods such as flexography, gravure, silk screening, inkjet printing or offset lithography. Deposition methods also include subtractive methods such as coating methods, evaporation, sputtering, and sublimation.

Figure 13:
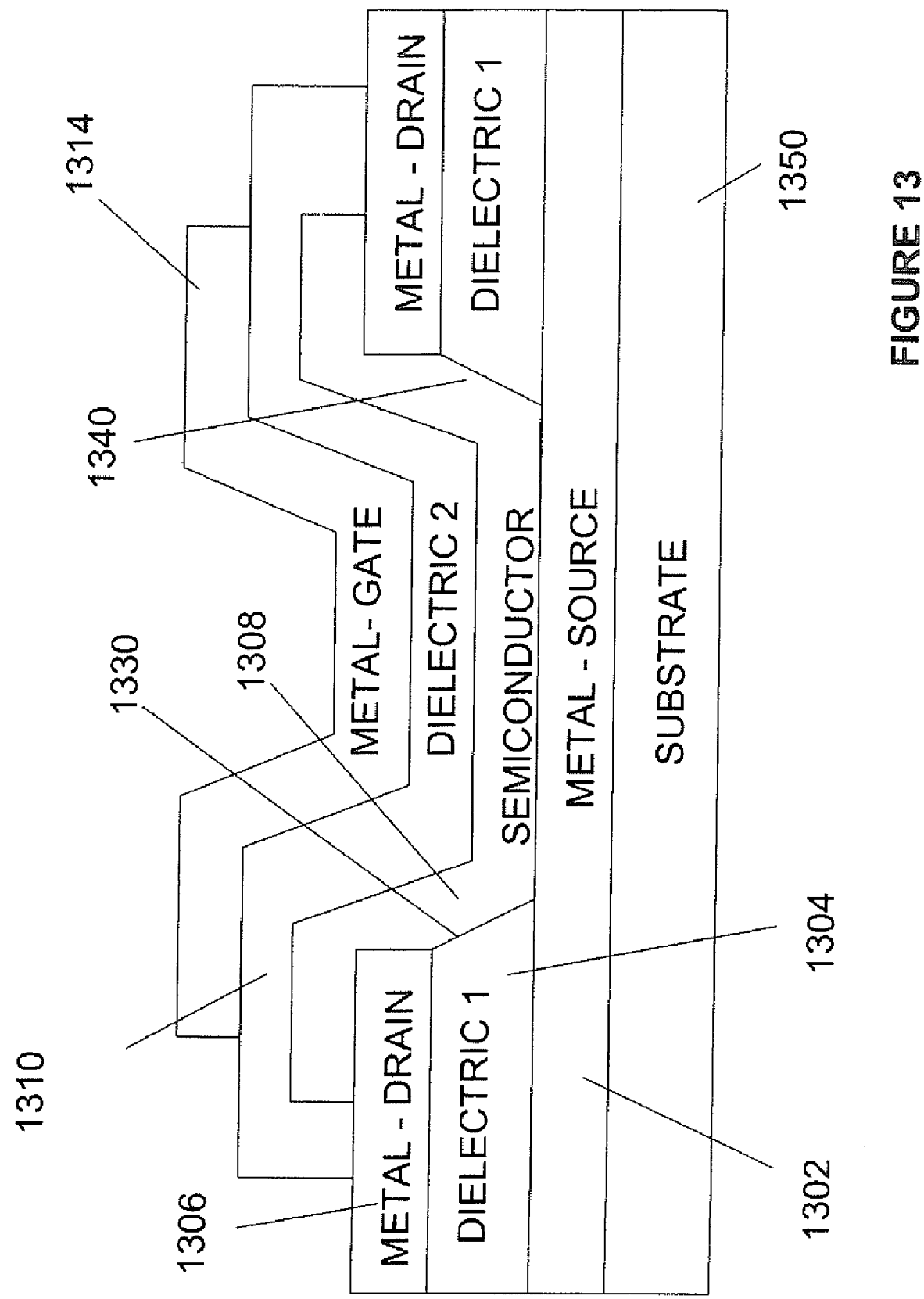

FIG. 13 illustrates the deposition of metal-gate 1314. This layer must be patterned to reside on the surface of the second dielectric 1310. In order to be electrically functional, this metal layer must cover the second dielectric layer 1310 along the channel of the transistors defined by edges 1330 and 1340 in FIG. 13. This layer acts as a gate terminal of the transistor, controlling the number of charge carriers that flow through the transistor from source to drain.

Figure 14:
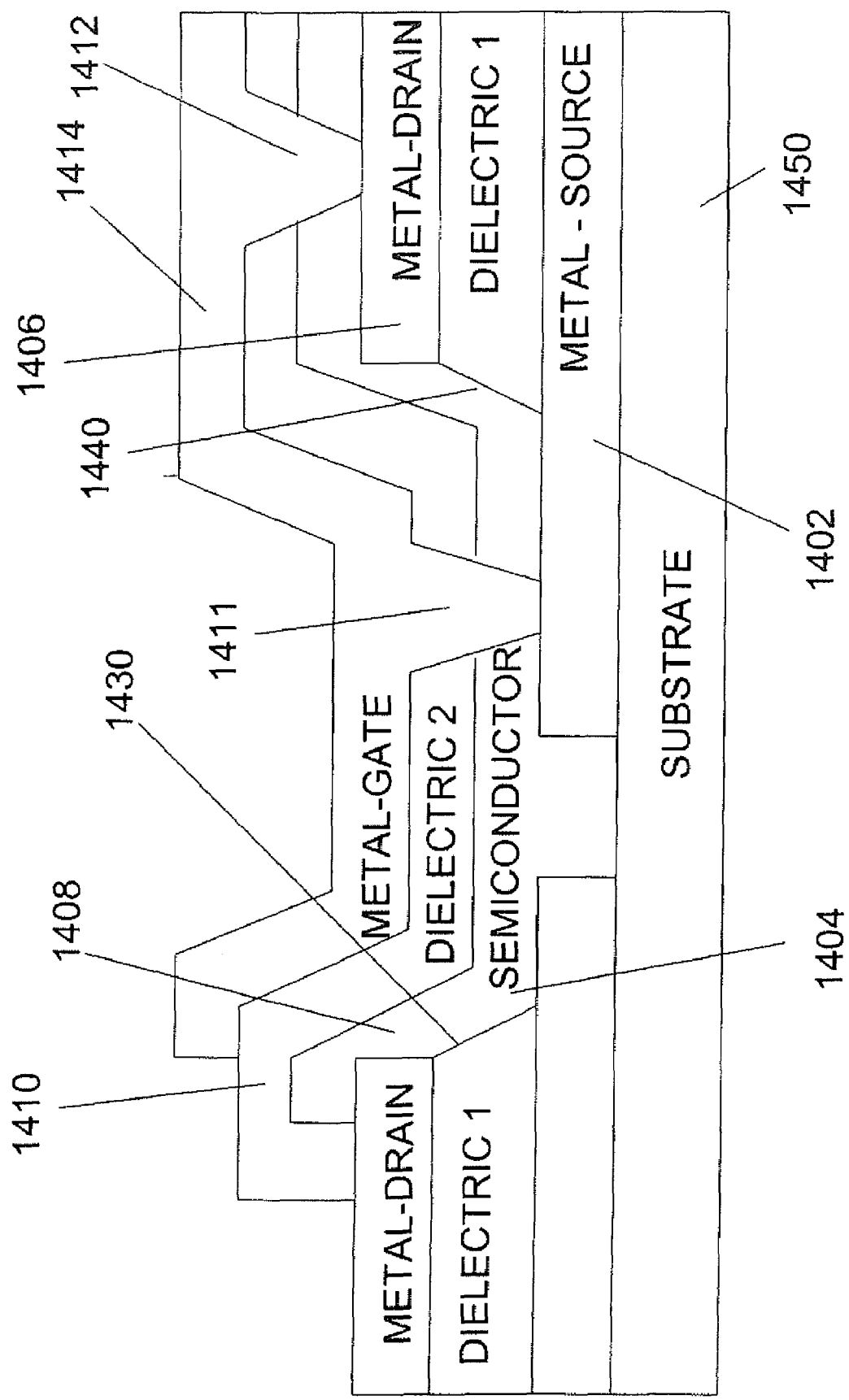
FIGS. 14-15 illustrates the method by which contact holes for interconnecting metal layers are integrated into the process accounting to another embodiment of the present invention.

The above description illustrates the formation of the transistors. In a complete circuit design, these transistors are interconnected by connecting appropriate metal-gate regions, metal-drain regions, and metal-source regions through openings in the first dielectric and the second dielectric, as shown in FIG. 14. Opening 1411 in the second dielectric 1410 and semiconductor layer 1404 forms a connection between metal-gate 1414 and metal-source 1402 of the transistor whose channel is defined by 1440. These holes can be formed by leaving the hole when the dielectric and semiconductor is printed, or producing them through a subtractive process including laser ablation, etching or lift-off. If the holes are of appropriate size and the conductive ink is sufficiently low in viscosity, the dielectric ink will flow into these holes. It should be noted that when this technique is used to make contact through the contact holes, a contact hole from metal-drain layer 1406 to metal-source layer 1402 is not permitted. The metal-drain layer 1406 is formed in a self-aligned manner to the raised surfaces, and will therefore not flow into contact holes formed on that layer. From the circuit design point of view, this does not constitute a limitation since electrical contact since electrical contact between metal-drain 1406 and metal-source 1402 can still be made by forming two contacts to produce that connection. As illustrated in FIG. 14, opening 1412 forms a connection between metal-gate 1414 and metal-drain 1406 and opening 1411 forms a connection between the same node metal-gate 141 and metal-source 1402, thereby forming an electrical contact between metal-source 1402 and metal-drain 1406.

Figure 15:
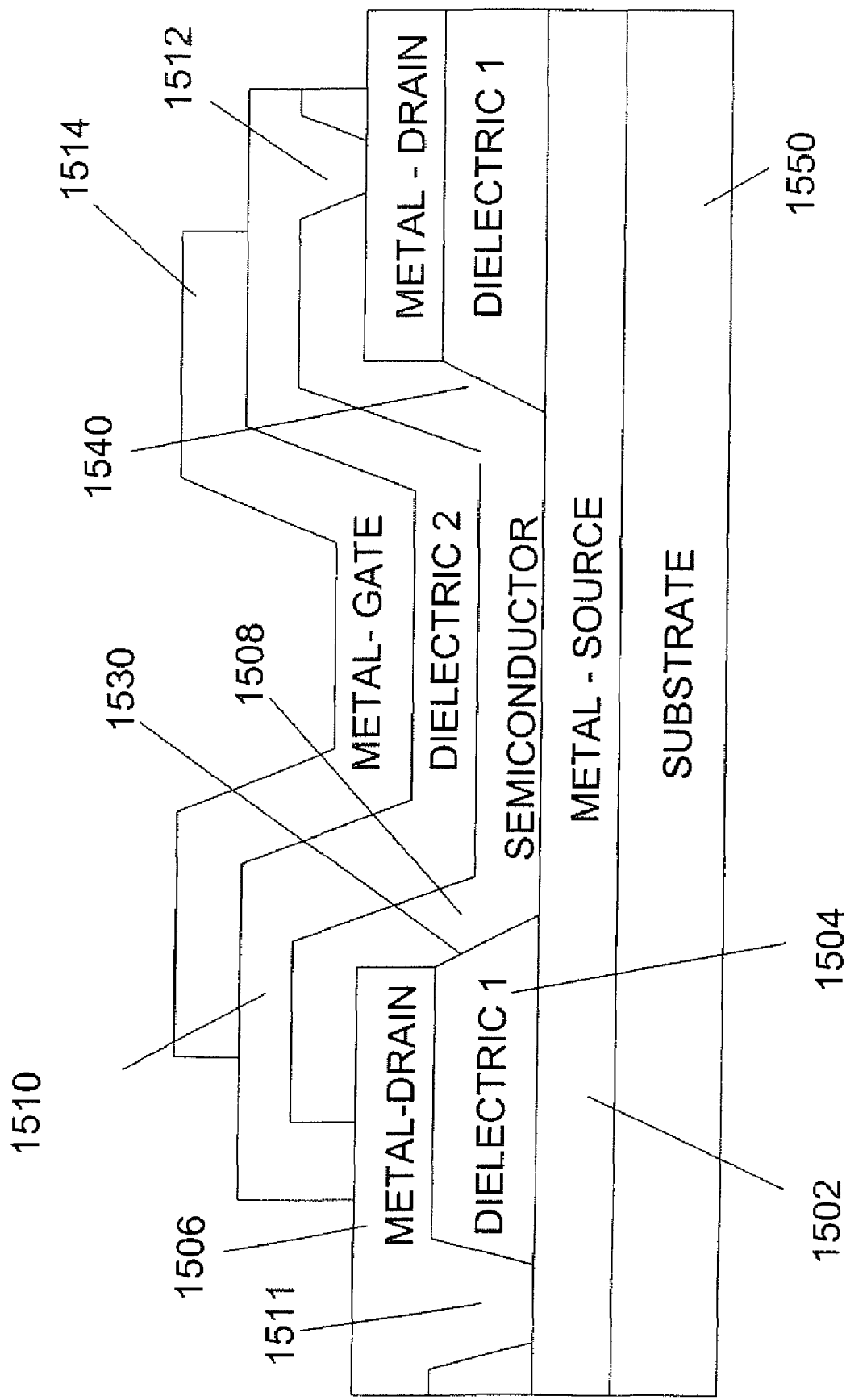

Alternatively, these contact holes can be plugged with by injecting conductive solution into the holes through methods such as inkjet printing. Vector-based inkjet printing with a low-viscosity conductive ink will be particularly effective since the walls around the contact holes will contain the conductive fluid. Plugging can also be achieved by electroplating since regions where thicker metal is not desired is covered by dielectric material, thereby protecting those areas from the electroplating agent. Electroless plating can also be used utilized as a method of filling the contact holes with conductive materials. When contact holes are plugged with a conductor, contact holes from metal-drain 1511 and metal-source 1502 are permitted, as illustrated in FIG. 15.

The layer thickness of the first dielectric layer 1504 determines the channel length of the transistor. As long as short channel Length effects of the transistor are appropriately managed and are tolerable, layer thicknesses as thin as 50 nm or even thinner are possible. It should be noted that such thin depositions require that the deposition means of metal-drain 1511 described above is well enough engineered not to inadvertently deposit metal in the trough formed by the dielectric, which becomes very shallow at such thin first dielectric layer thicknesses. On the other extreme, the thickness of the first dielectric 1530 could be on the order of tens of microns. Though the transistor device produced in this manner would result in lower on-current due to the increased channel length, the deposition method would not need to be as well engineered when the trough is that deep. A typical first dielectric thickness is in the range of 1-3 µm. Another thickness critical to device performance is the second dielectric, which is in the range of 100 nm to 500 nm thick, but could be thicker depending on the transistor performance target, or could be thinner provided the layer can be reproducibly deposited without pinholes. The thickness of other layers have only secondary effects on the transistor behavior, and therefore have very large ranges associated with them. Typical thicknesses of the semiconductor 1508, metal-drain 1511, metal gate 1514 ranges from 50 nm to 1 µm, but could be thicker or thinner depending on the precision of the deposition means and the transistor performance target.

While the invention has been described in detail in the foregoing description and illustrative embodiment, it will be appreciated by those skilled in the art that many variations may be made without departing from the spirit and scope of the invention. Thus, it may be understood, for example, that the structures above could include self-assembled monolayers (SAMs), corona treatment, or other surface treatments to obtain desired surface energy and contact angles for optimized print characteristics. The conductor layers may contain another conductive layer under the first conductor, second conductor, or third conductor layers in order to promote enhanced adhesion, or to increase or decrease wetting of the print surface. Metal layers may be treated with gold immersion or thiol processing to reduce oxidation, increase the effective work function of the metal, and promote desired alignment of the semiconductor polymer and crystalline structures. Dielectric layers may consists of two or more layers in order to promote adhesion, reduce leakage through the dielectric, alter the capacitance of the dielectric layers, or to enhance the capability of controlling the slope on the edges of the dielectric. Various curing steps either at each deposition step or at the end of the entire process may also be included.

We claim:

1. A method of fabricating an organic field-effect transistor comprising:
    forming a substrate layer;
    forming a conductive source layer on the substrate layer;
    forming a first dielectric layer on the conductive source layer, the first dielectric layer having a sloped edge, the sloped edge forming a channel length of the transistor;
    forming a self-aligned conductive drain layer on the first dielectric layer;
    forming a semiconductor layer on the sloped edge of the first dielectric layer;
    forming a second dielectric layer on the semiconductor layer formed on the sloped edge of the first dielectric layer; and
    forming a conductive gate layer on the second dielectric layer.

2. The method of claim 1 further comprising forming openings in the semiconductor and the second dielectric layers to allow contact to the conductive source layer.

3. The method of claim 1 further comprising forming openings in the semiconductor and the second dielectric layers to allow contact to the conductive drain layer.

4. The method of claim 1, wherein forming the self-aligned conductive drain layer comprises:
    coating a surface of a print plate with ink comprising a solution-based conductor; and
    applying the print plate to transfer the ink to a raised surface of the first dielectric layer, but not transferring the ink to troughs in the first dielectric layer.

5. The method of claim 4, wherein a pressure of the print plate is adjusted to optimize ink transfer only to the raised surface of the first dielectric layer, an optimized pressure being evidenced by a substantial lack of ink in the troughs in the first dielectric layer.

6. The method of claim 4, wherein a material of the print plate is chosen to optimize ink transfer only to the raised surface of the first dielectric.

7. The method of claim 4, wherein a slope of the first dielectric layer edge is controlled by adjusting a surface tension of the ink used to form the first dielectric layer and a surface energy of the conductive source layer.

8. The method of claim 7, wherein the surface tension of the ink used to form the first dielectric layer is modified by adding surfactants or by adjusting a weight-to-solid ratio of the ink solution.

9. The method of claim 7, wherein the surface energy of the conductive source layer is adjusted through a technique selected from the group consisting of corona treatment, oxygen plasma treatment, ultra-violet exposure, ozone treatments, and application of a material designed to modify the surface energy.

10. The method of claim 1 further comprising forming a first organic field-effect transistor, a second organic field-effect transistor, and a conductive gate layer common to the first and second organic field-effect transistors.

11. The method of claim 1, wherein the conductive source layer is formed using a solution-based conductor selected from the group consisting of flake silver ink, flake gold ink, nano-particle silver ink, nano-particle gold ink, PEDOT, polythiophene, and polyanaline.

12. The method of claim 4, wherein the print plate is coated with a conductive ink selected from the group consisting of a solution-based flake conductor ink, a solution-based nano-particle metal ink, PEDOT, polyanaline, polythiophene, or other solution-based conductive fluid.

13. The method of claim 1, wherein the semiconductor layer is formed using a low molecular weight material selected from the group consisting of pentacene, a hexylthiophene, TPD, and PBD.

14. The method of claim 1, wherein the semiconductor layer is formed using a polymer material selected from the group consisting of polythiophene, parathenylene vinylene, and polyphenylene ethylene.

15. The method of claim 1, wherein the semiconductor layer is formed using a hybrid material comprising polyvinyl carbazole.

16. The method of claim 1, wherein the second dielectric layer is formed using a printable material selected from the group consisting of spin-on-glass, polyvinyiphenol (PVP), polypropylene, CYTOP, polyvinylalcohol, polyisobutylene, PMMA, polyethylene terephthalate (PET), poly-p-xylene, and CYMM.

17. The method of claim 6, wherein an optimized plate material is evidenced by a substantial lack of ink in the troughs in the first dielectric layer.

* * * * *